(12) United States Patent
Kamdar

(10) Patent No.: US 8,914,548 B2
(45) Date of Patent: Dec. 16, 2014

(54) FAST MASKED SUMMING COMPARATOR

(75) Inventor: Chetan C. Kamdar, Austin, TX (US)

(73) Assignee: Apple Inc., Cupertino, CA (US)

( * ) Notice: Subject to any disclaimer, the term of this patent is extended or adjusted under 35 U.S.C. 154(b) by 761 days.

(21) Appl. No.: 13/214,535

(22) Filed: Aug. 22, 2011

(65) Prior Publication Data

US 2012/0198204 A1 Aug. 2, 2012

Related U.S. Application Data

(60) Provisional application No. 61/438,542, filed on Feb. 1, 2011.

(51) Int. Cl.
*G06F 12/14* (2006.01)
*H03K 5/24* (2006.01)

(52) U.S. Cl.
CPC .......................................... *H03K 5/24* (2013.01)
USPC ................................................... 710/1; 710/2

(58) Field of Classification Search
None
See application file for complete search history.

(56) References Cited

U.S. PATENT DOCUMENTS

| 4,245,325 A | 1/1981 | Kikuchi |
| 5,675,737 A | 10/1997 | Horie |
| 2010/0228944 A1 | 9/2010 | Bassett |

OTHER PUBLICATIONS

Cortadella, et al; "Evaluation of A+B=K Conditions Without Carry Propagation;" IEEE Transactions on Computers, vol. 41, No. 11, Nov. 1992, pp. 1484-1488.
"K=A+B Comparator;" Datapath Subsystems, Chapter 10, Section 10.4.3, Pearson Education, Inc., 2005.

*Primary Examiner* — Cheng-Yuan Tseng
(74) *Attorney, Agent, or Firm* — Meyertons, Hood, Kivlin, Kowert & Goetzel, P.C.; Stephen J. Curran

(57) ABSTRACT

A fast masked summing comparator apparatus includes a comparator unit configured to compare a masked first number to a masked sum of a second number and a third number to determine whether the masked sum is equivalent to the masked first number without performing a summation portion of an addition operation between the second number and the third number. The comparator unit may concurrently mask both the sum and the first number using the same mask value.

23 Claims, 3 Drawing Sheets

FAST MASKED SUMMING COMPARATOR

This patent application claims priority to Provisional Patent Application Ser. No. 61/438,542, filed Feb. 1, 2011, which is herein incorporated by reference in its entirety.

BACKGROUND

1. Technical Field

This disclosure relates to integrated circuits, and more particularly to summing comparator circuits.

2. Description of the Related Art

Many processors today use virtual addresses (VA) to access a paging system or other parts of the memory subsystem such as a cache memory, for example. In many cases, the VA is generated using some type of adder circuit. In addition, it may be desirable to compare the VA to a given value to determine if the VA falls within a particular address range. The address range is sometimes specified using a mask value. There are many types of summing comparators available. However, when a value has an associated mask value applied, the time it takes to perform the addition and the masked compare is in many cases unacceptable.

SUMMARY OF THE DISCLOSURE

Various embodiments of a fast masked summing comparator are disclosed. Broadly speaking, an apparatus is contemplated which can determine whether or not a masked value is equivalent to a masked sum of two numbers. More particularly, rather than having to perform the summation, the apparatus may use knowledge of the carry in required and the carry produced for equivalence. In addition, the masking operation is performed concurrently so that the determination may be made quickly.

In one embodiment, the apparatus includes a comparator unit configured to compare a masked first number to a masked sum of a second number and a third number to determine whether the masked sum is equivalent to the masked first number without performing a summation portion of an addition operation between the second number and the third number. The comparator unit may concurrently mask both the sum and the first number using the same mask value.

In one specific implementation, the comparator unit may determine whether the masked sum is equivalent to the masked first number in one clock cycle.

Figure 1:
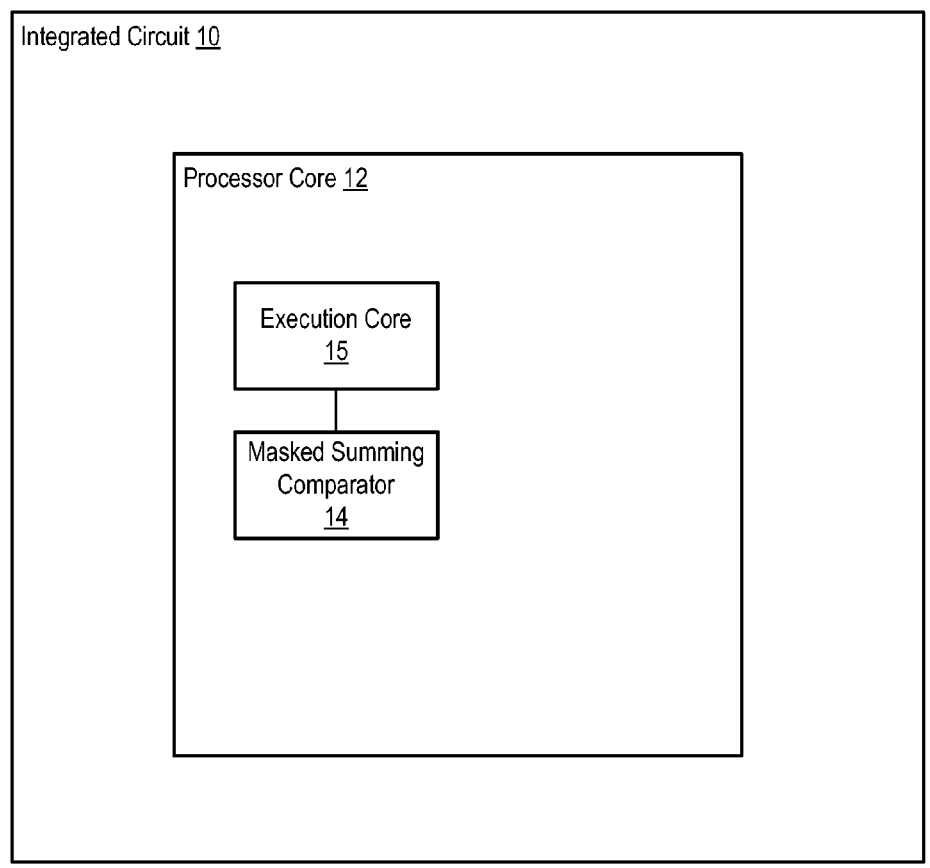
FIG. 1 is a block diagram of one embodiment of an integrated circuit including a processor having a masked summing comparator.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of an embodiment of an integrated circuit including a processor with a masked summing comparator is shown. The integrated circuit 10 includes a processor core 12. The processor core 12 includes an execution core 15 coupled to a masked summing comparator 14.

In one embodiment, the execution core 15 may be configured to execute instructions and to generate addresses. In many cases, virtual addresses are used in the processor core 12. In various embodiments, a masked summing compare operation may be useful for detecting whether a virtual address lands on a particular page of memory or within a particular address range, since the virtual address is generally the output of an adder. For example, the mask value may include values of the following form: 111110b, 111100b, 111000b, 110000b, and 100000b. This type of mask masks off some number of lower order address bits, for example. Whether this comparison is for debug purposes or some sort of hazard detection, in various embodiments the output of the comparator must be available quickly. One conventional method for doing this operation is to perform the addition of addresses A+B, followed by applying the mask, and then the comparison. In many cases, this is a two-cycle operation.

However, as described below, the masked summing comparator 14 may complete the operation (K & mask)==((A+B) & mask) in one cycle. A conventional K==A+B comparator logic may be used for most bits of the mask. However, the conventional comparator does not work at the zero to one transition point or "mask threshold bit" in the mask value. The mask threshold bit is the point in the mask where the 0's switch to 1's. For example, in the above mask values the mask threshold bit in the first value is the second bit from the right since this is the first bit having a logical one value. At this point, a carry produced must be the output of a carry tree, which is then compared against a normal carry-in required. The hardware description language (HDL) representation of an embodiment of the masked summing comparator 14 written in register transfer level (RTL) is shown below. In addition, when synthesized by a logic synthesis tool, a logic circuit similar to the a generalized logic block diagram shown in FIG. 2 may be created. However, it is noted that, depending on a number of factors, the actual logic that is synthesized may vary considerably from the diagram shown in FIG. 2. For example, different libraries may produce different logic, although they may be logically equivalent. Similarly, logic optimizations may be performed by the synthesis tool. As an example, the wire PCG statement in the RTL below is implemented differently (e.g., AND gate 219 and OR gate 217) in FIG. 2, although it is logically equivalent.

The following RTL representation of one embodiment of the masked summing comparator 14 is as follows:

```
module masked_addcompare
(
  a_i,
  b_i,
  s_i,
  mask_i,
  match_o
);
  parameter COMPAREHI=31;
  parameter COMPARELO=12;
  input [COMPAREHI:COMPARELO]   a_i;
  input [COMPAREHI:COMPARELO]   b_i;
  input [COMPAREHI:COMPARELO]   s_i;
  input [COMPAREHI:COMPARELO]   mask_i;
  output match_o;
  wire [COMPAREHI:COMPARELO]   cip_i;
    // cip_i[N] = carru_out(a_i[N-1:0] + b_i[N-1:0] + c_i)
  wire [COMPAREHI:COMPARELO] mask_incremented =
{mask_i[COMPAREHI-1:COMPARELO],1'b0};
  wire [COMPAREHI:COMPARELO] mask_one_hot_threshold =
  (mask_i[COMPAREHI:COMPARELO] ^
mask_incremented[COMPAREHI:COMPARELO]);
  wire       mask_threshold_cip = | (mask_one_hot_threshold &
cip_i);
  wire [COMPAREHI:COMPARELO]   cir; // cin required
  wire [COMPAREHI:COMPARELO] P =
a_i[COMPAREHI:COMPARELO] ^ b_i[COMPAREHI:COMPARELO];
  wire [COMPAREHI-1:COMPARELO] G =
a_i[COMPAREHI-1:COMPARELO] &
b_i[COMPAREHI-1:COMPARELO];
  assign cir[COMPAREHI:COMPARELO]   =
P[COMPAREHI:COMPARELO] ^ s_i[COMPAREHI:COMPARELO];
  wire [COMPAREHI:COMPARELO] PCG; // speculative cin produced
if the compare works out
    assign PCG[COMPAREHI:COMPARELO+1] =
P[COMPAREHI-1:COMPARELO] &
cir[COMPAREHI-1:COMPARELO] |
G[COMPAREHI-1:COMPARELO];
    assign PCG[COMPARELO] = cip_i[COMPARELO];
  wire [COMPAREHI:COMPARELO] bitwise_miscompare =
(PCG[COMPAREHI:COMPARELO] ^
cir[COMPAREHI:COMPARELO]);
  wire [COMPAREHI:COMPARELO]
above_mask_bitwise_miscompare =
bitwise_miscompare[COMPAREHI:COMPARELO] &
~mask_incremented[COMPAREHI:COMPARELO];
  wire       above_mask_error_compare =
|above_mask_bitwise_miscompare; // flop boundary
  wire       mask_threshold_cir =
  | (mask_one_hot_threshold[COMPAREHI:COMPARELO] &
cir[COMPAREHI:COMPARELO]); // shift the mask up to compare
cir_i with cip_i-1
    assign       match_o = (mask_threshold_cip ==
mask_threshold_cir) & ~above_mask_error_compare;
endmodule
```

Figure 2:
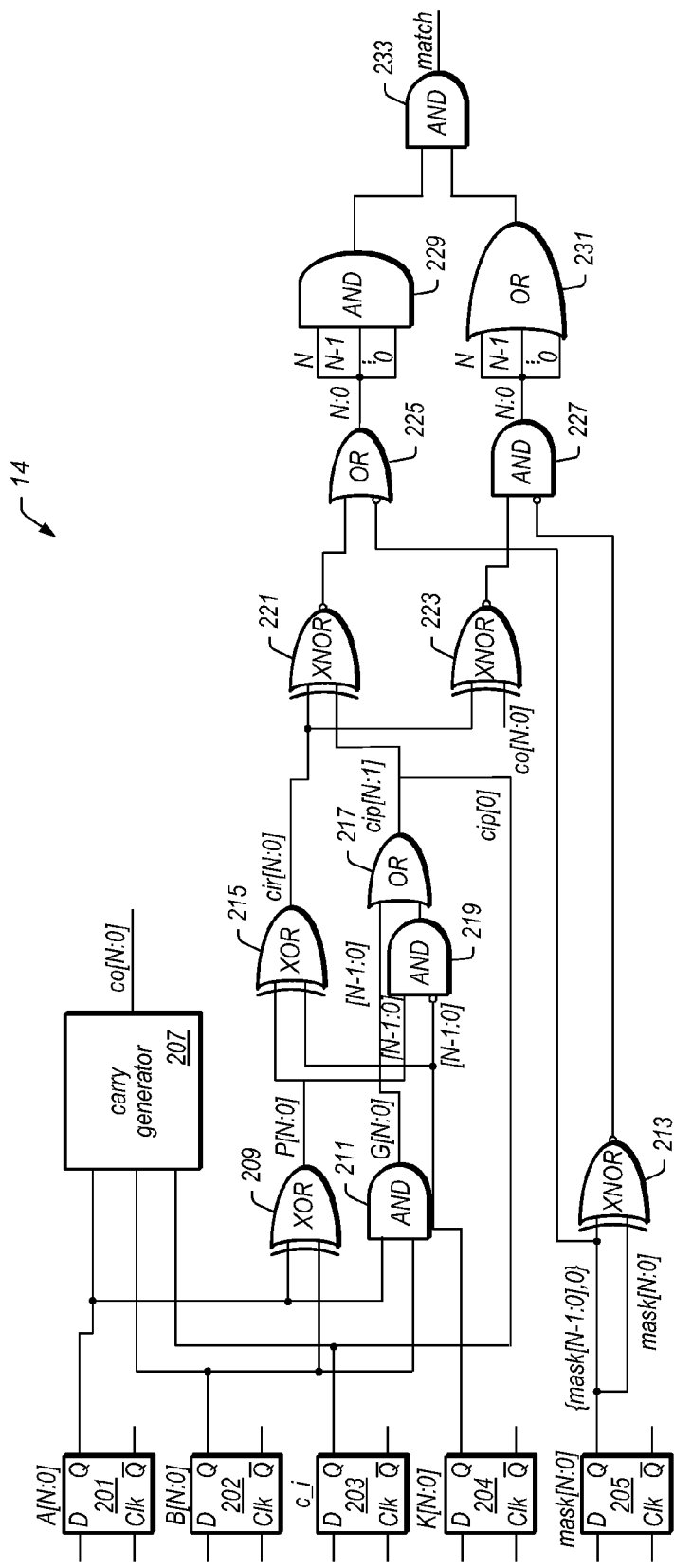
FIG. 2 is a block diagram of one embodiment of the masked summing comparator of FIG. 1.

Referring to FIG. 2, a block diagram of one embodiment of the masked summing comparator of FIG. 1 is shown. The masked summing comparator 14 includes a number of input flip-flops (e.g., FF201-FF205). FF201 is coupled to receive the first value 'A', the FF202 is coupled to receive the second value 'B', the FF203 is coupled to receive the carry in bit, the FF204 is coupled to receive the compare value 'K', and the FF205 is coupled to receive the mask value 'mask'. As shown, the A and B inputs (e.g., A[N:0] and B[N:0]) are coupled to a carry generator 207, to the exclusive-OR (XOR) gate 209, and to the AND gate 211. In one embodiment, the carry generator 207 may be the carry tree logic from a typical adder circuit. The carry-in input (e.g., c_i) is coupled to the carry generator 207 and to one input of the XNOR gate 221 as cip[0]. In one embodiment, the value of the c_i input may be instruction dependent. The K input (e.g., K[N:0]) is coupled to the negated input of the AND gate 219 and to one input of the XOR gate 215. The mask input (e.g., mask[N:0]) is coupled to one input of the XNOR gate 213. The incremented mask input (e.g., mask[N:1:0], 0) is coupled to the other input of the XNOR gate 213 and to the negated input of the OR gate 225. The output of the XNOR gate 213 is coupled to the negated input of AND gate 227. The output of the carry generator 207 is coupled to the one input of the XNOR gate 223. The output of the XOR gate 209 is coupled to one input of the AND gate 219 and to one input of the XOR gate 215. The output of the AND gate 211 is coupled to one input of the OR gate 217. The output of the AND gate 219 is coupled to the other input of the OR gate 217. The output of the OR gate 217 is coupled to the same input of XNOR gate 221 as cip[0]. The output of the XOR gate 215 is coupled to the other input of the XNOR gate 221 and to the other input of XNOR gate 223. The output of the XNOR gate 223 is coupled to the other input of AND gate 227. The output of the XNOR gate 221 is coupled to the other input of OR gate 225.

It is noted that as shown in FIG. 2 the logic starting at the far left and moving to the right to the OR gate 225 and AND gate 227 represents one bit or a bitslice of a multi-bit [N:0] circuit. However, as shown the inputs of AND gates 229 and 231 are coupled to all the bitslice outputs. Accordingly, the outputs of the OR gate 225 are coupled to the inputs of the AND gate 229 and the outputs of the AND gate 227 are coupled to the inputs of OR gate 231. The outputs of AND gate 229 and OR gate 231 are coupled to the inputs of AND gate 233.

The masked summing comparator 14 is configured to perform the masked comparison operation using knowledge of the input values A and B, and the knowledge of what the carry in to each bit must be if K=A+B. Thus, the actual addition of A and B need not be performed since no carry propagation is necessary. Thus, adjacent pairs of carry bits may be checked to verify that a previous bit produces the required carry in to produce the compare bit value. Then, all bit pairs may be checked for the same property using, for example, a one's detector.

Accordingly, for each bit i the required carry-in required ($c_{i-1}R$) may be represented by $$c_{i-1}R = A_i \oplus B_i \oplus K_i \quad (1)$$

which is manifested in the logic of FIG. 2 as the XOR gate 209 and XOR gate 215. In addition, for each bit i−1, the carry produced ($c_{i-1}P$) by the previous bit may be represented by $$c_{i-1}P = (A_{i-1} \oplus B_{i-1}) \overline{K}_i A_{i-1} \cdot B_{i-1} \quad (2)$$

which is manifested in the logic of FIG. 2 as XOR gate 209, AND gate 211, AND gate 219, and OR gate 217. The logic for equations 1 and 2 may be referred to as the carry propagation logic. The carry results from the above equations produce a truth table as shown in Table 1 below.

TABLE 1

Required and generated carries for K = A + B

| $A_i$ | $B_i$ | $K_i$ | $C_{i-1}$ Required | $C_i$ Produced |
|---|---|---|---|---|
| 0 | 0 | 0 | 0 | 0 |
| 0 | 0 | 1 | 1 | 0 |
| 0 | 1 | 0 | 1 | 1 |
| 0 | 1 | 1 | 0 | 0 |
| 1 | 0 | 0 | 1 | 1 |
| 1 | 0 | 1 | 0 | 0 |
| 1 | 1 | 0 | 0 | 1 |
| 1 | 1 | 1 | 1 | 1 |

In the compare operation, the one's detector would include performing an XNOR on the carry in required and the carry produced for each bit and then comparing all the XNOR result bits to see if there is a match. Thus, the compare logic includes XNOR gates 221 and 223, AND gates 227 and 229, and OR gates 225 and 231.

However, with the masking operation, the mask value determines whether the result of the compare result of cip[N:1] and cir[N:0] bits is used as long as there is no mask threshold bit. However, when the mask threshold bit is encountered, rather than the cip, the result of the carry out co[N:0] from the carry generator 207 must be compared against the cir[N:0]. Thus, the XNOR gate 213 detects the mask threshold bit.

More particularly, as long as there is no mask threshold bit and the mask bits are logic ones, the OR gate 225 allows whatever value is on the other input to pass through. Thus the compare result of cip[N:1] and cir[N:0] is passed through to the AND gate 229. However, when the mask bits are logic zeros, the OR gate 225 will always output a logic one, which is indicative that the cip and cir bits are the same. But since the address bits are masked anyway, the output of OR gate 225 doesn't matter. In addition, the mask bits at the input to the XNOR gate 213 are either both logic zeros or both logic ones which keeps the output of AND gate 227 at a logic zero.

Upon the occurrence of the mask threshold bit, the mask incremented bit is a logic zero, the mask bit is a logic one, and the output of the XNOR gate 213 changes to a logic zero, which allows the result of the comparison at the XNOR gate 223 of the carry out co[N:0] from the carry generator 207 and the cir[N:0] to be used. Thus, the OR gate 225 is providing a logic one to AND gate 229, and if the co[N:0] is equal to the cir[N:0], then a match will be detected.

It is noted that only one bit of the multi-bit comparison at the threshold bit will be active at a time. The remaining bits will be at a logic zero due to the output of the XNOR 213 gating the other input to the AND gate 227. Furthermore, if the K is, in fact, equal to A+B, then the result of the XNOR gate 223 will be a logic one for at least one of the inputs to OR gate 231 and a match will be detected, and if not, then a match will not be detected.

In one embodiment, for the mask values that were given above, the above RTL assumes that a mask bit value of a logic zero masks the address comparison while a mask bit value of logic one allows the comparison value to propagate as shown. It is contemplated that in other embodiments, a mask bit value of zero masks the comparison while a mask bit value of one allows the comparison value to propagate. In such other embodiments, the inversion or negation would be removed on the input of AND gate 225.

Figure 3:
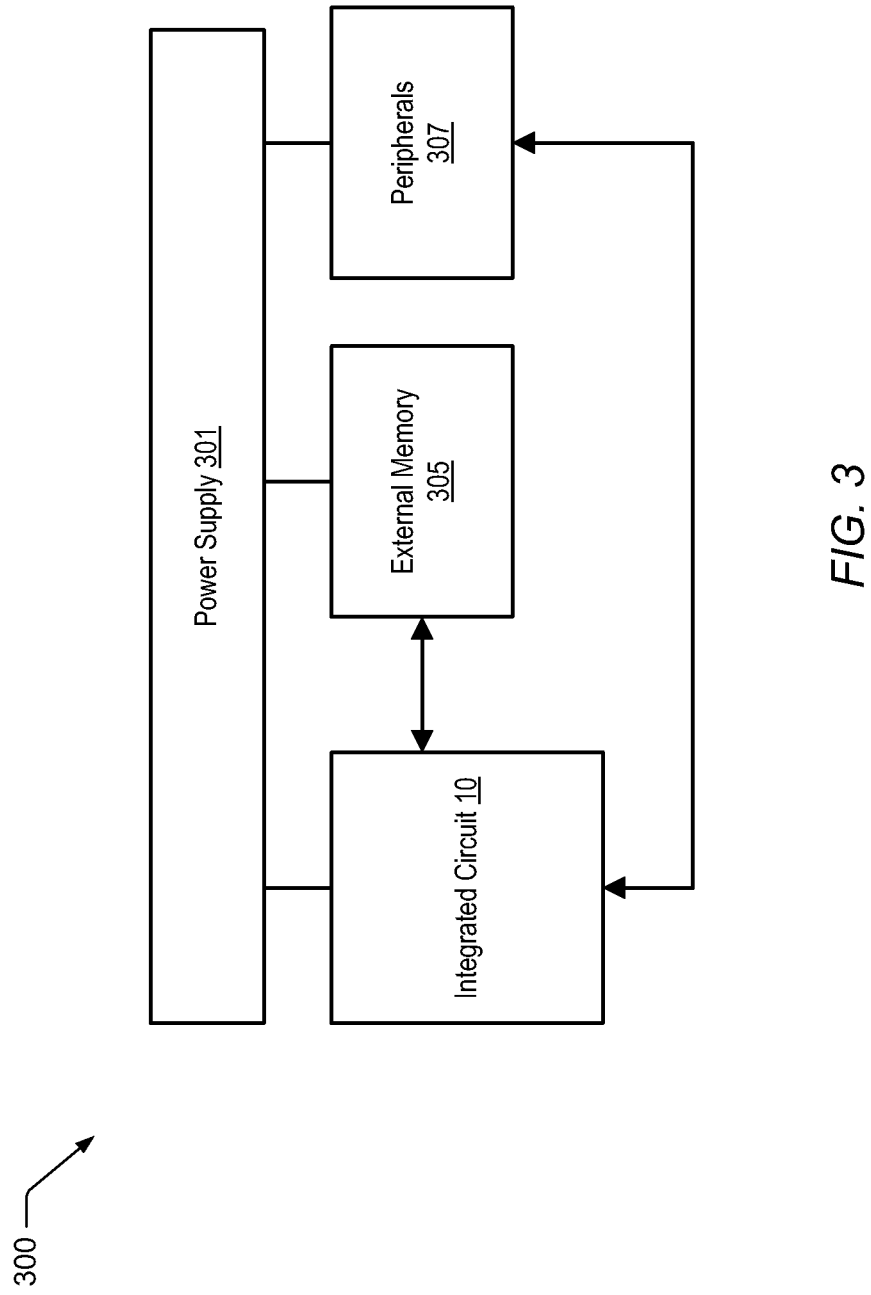
FIG. 3 is a block diagram of one embodiment of a system.

Turning to FIG. 3, a block diagram of one embodiment of a system is shown. The system 300 includes an integrated circuit 10 coupled to one or more peripherals 307 and an external system memory 305. The system 300 also includes a power supply 301 that may provide one or more supply voltages to the integrated circuit 10 as well as one or more supply voltages to the memory 305 and/or the peripherals 307.

In the illustrated embodiment, the system 300 includes at least one instance of the integrated circuit 10. The integrated circuit 10 may include one or more instances of the processor core 12 (from FIG. 1). The integrated circuit 10 may, in one embodiment, be a system on a chip including one or more instances of the processor core 12 and various other circuitry such as a memory controller, video and/or audio processing circuitry, on-chip peripherals and/or peripheral interfaces to couple to off-chip peripherals, etc.

The peripherals 307 may include any desired circuitry, depending on the type of system. For example, in one embodiment, the system 300 may be included in a mobile device (e.g., personal digital assistant (PDA), smart phone, etc.) and the peripherals 307 may include devices for various types of wireless communication, such as WiFi, Bluetooth, cellular, global positioning system, etc. The peripherals 307 may also include additional storage, including RAM storage, solid-state storage, or disk storage. The peripherals 307 may include user interface devices such as a display screen, including touch display screens or multitouch display screens, keyboard or other input devices, microphones, speakers, etc. In other embodiments, the system 300 may be included in any type of computing system (e.g. desktop personal computer, laptop, workstation, net top etc.).

The external system memory 305 may include any type of memory. For example, the external memory 1005 may be in the DRAM family such as synchronous DRAM (SDRAM), double data rate (DDR, DDR2, DDR3, etc.), or any low power version thereof. However, external memory 305 may also be implemented in SDRAM, static RAM (SRAM), or other types of RAM, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
    a comparator unit configured to compare a masked first number to a masked sum of a second number and a third number to determine whether the masked sum is equivalent to the masked first number without performing a summation portion of an addition operation between the second number and the third number;
    wherein the comparator unit is configured to concurrently mask both the sum and the first number using a same mask value.

2. The apparatus as recited in claim 1, wherein the comparator unit is configured to determine whether the masked sum is equivalent to the masked first number in one clock cycle.

3. The apparatus as recited in claim 1, wherein the mask value comprises a multi-bit binary value having a number of logic ones beginning at the most significant bit followed by a number of logic zeros, wherein there are no intervening logic zeros between the logic ones and no intervening logic ones between the logic zeros.

4. The apparatus as recited in claim 1, wherein the comparator unit is configured to determine for each pair of bits of the first, second, and third numbers, whether a carry that would be produced by a previous bit during an addition of the second number and the third number is equivalent to a carry-in that would be required to determine whether the sum is equivalent to the first number.

5. The apparatus as recited in claim 4, wherein the comparator unit to determine whether the sum is equivalent to the first value, is configured to generate, for each bit in the first and second numbers:
   an indication of whether a carry would be produced by the previous bit during the addition based upon the first, second, and third numbers; and
   a carry-in that would be required to produce the third number during the addition of the first and the second numbers.

6. The apparatus as recited in claim 5, wherein the comparator unit includes a carry generator unit configured to generate a carry indication for each bit of the first and second numbers that indicates whether a carry is generated for each bit of a first number being added to a second number and based upon the first and second numbers and a carry-in value.

7. The apparatus as recited in claim 6, wherein the comparator unit is configured to compare the carry indication generated by the carry generator with the carry-in required in response to detecting a transition from a logic zero to a logic one in the mask value.

8. An apparatus comprising:
   a comparator unit configured to compare a first result with a second result to determine whether the first result is equivalent to the second result;
   wherein the comparator unit is configured to apply a mask value to a first value to generate the first result; and
   wherein the comparator unit is further configured to concurrently apply the mask value to a sum of a second value and a third value to generate the second result without performing a summation portion of an addition of the second and third values.

9. The apparatus as recited in claim 8, wherein the comparator is configured to determine whether the first result is equivalent to the second result in one clock cycle.

10. The apparatus as recited in claim 8, wherein the comparator is configured to determine for each bit of the first value, the second value, and the third value, whether a carry-in that would be produced during an addition of the second value and the third value is equivalent to a carry-in that would be required to produce the first value during the addition to determine whether the sum is equivalent to the first value.

11. The apparatus as recited in claim 10, wherein the comparator is configured to determine that the sum is not equivalent to the first value if any carry-in produced is not equivalent to an associated carry-in required for a given bit of any of the first, second, or third values.

12. The apparatus as recited in claim 8, wherein the mask value comprises a multi-bit binary value having a number of logic ones beginning at the most significant bit followed by a number of logic zeros, wherein there are no intervening logic zeros between the logic ones and no intervening logic ones between the logic zeros.

13. A processor comprising:
   an execution unit including an address generation unit configured to generate memory addresses;
   an address detection unit coupled to the execution unit, wherein the address detection unit includes a comparator unit configured to detect selected address ranges using a mask value;
   wherein the comparator unit is configured to compare a masked first address value to a masked sum of a second address value and a third address value to determine whether the masked sum is equivalent to the masked first address value without performing a summation portion of an addition operation between the second address value and the third address value;
   wherein the comparator unit is configured to concurrently mask both the sum and the first address value using a same mask value.

14. The processor as recited in claim 13, wherein the comparator unit is configured to determine whether the masked sum is equivalent to the masked first number in one clock cycle.

15. The processor as recited in claim 13, wherein the mask value comprises a multi-bit binary value having a number of logic ones beginning at the most significant bit followed by a number of logic zeros, wherein there are no intervening logic zeros between the logic ones and no intervening logic ones between the logic zeros.

16. The processor as recited in claim 13, wherein the comparator unit is configured to determine for each pair of bits of the first, second, and third numbers, whether a carry that would be produced by a previous bit during an addition of the second number and the third number is equivalent to a carry-in that would be required to produce the first number based upon the first, second, and third numbers.

17. The processor as recited in claim 16, wherein the comparator unit includes a carry generator unit configured to generate a carry indication for each bit of the first and second numbers that indicates whether a carry is generated for each bit of a first number being added to a second number and based upon the first and second numbers and a carry-in value.

18. The processor as recited in claim 17, wherein the comparator unit is configured to compare the carry indication generated by the carry generator with the carry-in required in response to detecting a transition from a logic zero to a logic one in the mask value.

19. A method comprising:
   a comparator unit comparing, by a comparator unit, a masked first number to a masked sum of a second number and a third number to determine whether a masked sum is equivalent to the masked first number without performing a summation portion of an addition operation between the second number and the third number;
   the comparator unit concurrently masking, by a comparator unit, both the sum and the first number using a same mask value.

20. An apparatus comprising:
   a carry generator configured to generate a carry indication that indicates whether a carry is generated for each bit of a first number being added to a second number to produce a third number;
   a carry propagation logic configured to generate a carry-in required indication and a carry produced indication based upon the first number, the second number, and the third number;
   a mask threshold detector configured to provide an indication that a mask value has transitioned from a logic zero to a logic one;
   a comparator unit coupled to the carry generator, the mask threshold detector, and the carry propagation logic, wherein the comparator unit is configured to compare the carry in required and the carry produced to determine whether a first result of the mask value applied to the third number is equivalent to a second result of the mask value being applied to a sum of the first number and the second number without performing a final summing operation.

21. The apparatus as recited in claim 20, wherein in response to detecting the mask transition indication for a given bit of the first and second numbers, the comparator unit is configured to compare the carry indication, instead of the carry produced, with the carry-in required.

22. The apparatus as recited in claim 20, wherein the mask value comprises a multi-bit binary value having a number of logic ones beginning at the most significant bit followed by a number of logic zeros, wherein there are no intervening logic zeros between the logic ones and no intervening logic ones between the logic zeros.

23. The apparatus as recited in claim 20, wherein the comparator unit to determine whether the sum is equivalent to the first value, is configured to generate, for each bit 'i' in the first and second numbers a carry-in required indication and a carry produced indication based upon the first number, the second number, and a third number, wherein the carry-in required is generated based upon the equation $c_{i-1}R = A_i \oplus B_i \oplus K_i$, and the carry produced indication is generated based upon the equation $c_{i-1}P = (A_{i-1} \oplus B_{i-1})\overline{K}_i + A_{i-1} \cdot B_{i-1}$, where A is the first number, B is the second number and K is the third number.

\* \* \* \* \*